United States Patent
Sung et al.

(10) Patent No.: US 6,468,864 B1
(45) Date of Patent: Oct. 22, 2002

(54) METHOD OF FABRICATING SILICON NITRIDE READ ONLY MEMORY

(75) Inventors: Jiann-Long Sung, Taipei (TW); Chen-Chin Liu, Hsinchu (TW); Chia-Hsing Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/927,645

(22) Filed: Aug. 10, 2001

(30) Foreign Application Priority Data

Jun. 21, 2001 (TW) ........................................ 90115049 A

(51) Int. Cl.$^7$ ............................................ H01L 21/331
(52) U.S. Cl. ..................... 438/261; 438/287; 438/291; 438/293
(58) Field of Search ............................... 438/216, 261, 438/286, 287, 288, 289, 291, 530, 545, 551, 555, 591, 923, 954

(56) References Cited

U.S. PATENT DOCUMENTS 5,837,587 A * 11/1998 Wei ............................ 438/291
6,232,166 B1 * 5/2001 Ju et al. ...................... 438/527

OTHER PUBLICATIONS

Wolf, "Silicon Processing for the VLSI Era", vol. 1, 1986, pp. 303–308.*

* cited by examiner

Primary Examiner—Chandra Chaudhari
(74) Attorney, Agent, or Firm—J.C. Patents

(57) ABSTRACT

A method of fabricating silicon nitride read only memory. A trapping layer is formed on a substrate. Next, a patterned photoresist layer is formed, and the substrate region at the lower section of the trapping layer masked by the photoresist layer is defined as a channel region. The substrate region at the lower section of the trapping layer and no masked by the photoresist layer is defined as a source/drain region. Next, a pocket ion implantation is performed while using the photoresist layer as amask, and a first dopant is implanted into the source/drain region of the substrate. The photoresist layer is used as a mask and the source/drain ions are implanted. A second dopant is implanted into the source/drain region of the substrate. After that, the photoresist layer is removed. Next, the trapping layer is used as a mask, and a thermal process is performed so that the substrate surface of the source/drain region forms a buried source/drain oxide layer, while at the same time, the second dopant at the lower section of the buried source/drain oxide layer forms a buried source/drain. The first dopant forms the pocket doping region at the edge of the channel region of the buried source/drain periphery as a result of thermal diffusion. Finally, a conductive gate is formed on the substrate.

9 Claims, 3 Drawing Sheets

METHOD OF FABRICATING SILICON NITRIDE READ ONLY MEMORY

CROSS-REFERENCE TO RELATED APPLICATION

This application claims the priority benefit of Taiwan application Serial No. 90115049, filed Jun. 21, 2001.

BACKGROUND OF THE INVENTION

1. Field of the Invention

The present invention relates to a method of fabricating a pocket doping region, and more particularly, a method of fabricating a pocket doping silicon nitride read only memory by employing a thermal diffusion method.

2. Description of the Related Art

The gate portion of a conventional erasable programmable read-only memory (EPROM), flash EPROM, or flash electrically erasable programmable read-only memory (Flash EEPROM) comprises a floating gate and a control gate. During data write-in, thermal electrons enter the floating gate via the pocket doping region of the substrate at the lower section of the floating gate, tunneling through the thin silicon dioxide layer located at the lower section of the floating gate, and are trapped in the floating gate so as to store the write-in data.

Conventional floating gates are formed from polysilicon, and as a result of a demand for higher integration in semiconductors, the problem of current leakage occurs. Thus, a conventional solution to this problem is to replace the floating gate with a trapping layer structure formed from silicon oxide-silicon nitride-silicon oxide and to store carriers in the insulating silicon nitride by hot carrier implantation so as to attain the objective of data storage. A silicon oxide-silicon nitride-silicon oxide memory element of the trapping layer is known as a silicon nitride read only memory (NROM), ONO EEPROM or SONOS element based on the method of operation thereof.

A conventional silicon nitride read only memory element includes a substrate having a silicon oxide-silicon nitride-silicon oxide structure (ONO): lower silicon oxide layer, silicon nitride layer, and top silicon oxide dielectric layer. A gate conductive layer is formed on top of the silicon oxide/silicon nitride/silicon oxide structure. A source/drain region is provided in the substrate at the two lateral sides of the silicon oxide-silicon nitride-silicon oxide. A channel region is provided at the lower section of the two lateral sides of the silicon oxide-silicon nitride-silicon oxide structure and between the source/drain region. Furthermore, a pocket doping region is provided at the lower section of the two lateral sides of the silicon oxide/silicon nitride/silicon oxide structure and adjacent to the source/drain region.

Tilt angle ion implantation is used in the convention method of fabricating pocket doping region, and a dopant is implanted into a channel region periphery and the connection of a pre-fabricated source/drain extension. That is, tilt angle ion implantation is used to implant the dopant in the predetermined region. After that, a thermal process is performed so that the implanted dopant is evenly distributed to form a pocket doping region.

Because the pocket doping region employs tilt angle ion implantation to implant a dopant, in the course of implantation, the shape of the region of the implanted dopant cannot be effectively controlled. After the thermal process, the pocket doping region extends into a larger region, causing a length shortening of the channel region positioned below the silicon oxide-silicon nitride-silicon oxide structure.

In the course of the development of higher integration in semiconductor devices, and due to the fact that the pocket doping region formed by the conventional tilt angle implantation process cannot be reduced, in the course of reduction of the gate line width, the channel region positioned below the gate suffers significant shortening, and the pocket doping region adjacent to the source and drain cause an increase of threshold voltage. In other words, the reverse short channel effect affects the electrical property and performance of the device.

SUMMARY OF THE INVENTION

Accordingly, it is an object of the present invention to provide a method of fabricating a silicon nitride read only memory in which the pocket doping region is formed along the edge of the source/drain and does not cause a channel region shortening so that the element has excellent electrical properties.

In order to solve the above-mentioned drawbacks, the pocket implanted dopant is vertically implanted into a predetermined source/drain region, and at the same time, a thermal process is employed to form buried a source/drain region, so that the pocket implanted dopant thermally diffuses to the channel of the substrate at the bottom of the silicon oxide-silicon nitride-silicon oxide to form the pocket doping region. By means of the rate of the thermal diffusion of the present invention in controlling the size and the configuration of the pocket doping region, the reverse short channel effect can be avoided, breakdown and damage of the element are prevented, and the production yield is improved.

The present invention relates to a method of fabricating silicon nitride read only memory. A trapping layer is formed on a substrate. Next, on the substrate, a patterned photoresist layer is formed, the substrate region at the lower section of the trapping layer masked by the photoresist layer is defined as a channel region, and the substrate region at the lower section of the trapping layer unmasked by the photoresist layer is defined as a source/drain region. A pocket ion implantation step is then performed while using the photoresist layer as a screen. A first dopant is implanted into the source/drain region of the substrate and then the photoresist layer is used as the screen while the source/drain ion implantation step is performed and a second dopant is implanted into the source/drain region of the substrate. After that, the photoresist layer is removed. Next, the trapping layer is used as a screen, and a thermal process is performed so that the substrate surface of the source/drain region is formed into a buried source/drain oxide layer. At the same time, the second dopant at the lower section of the buried source/drain oxide layer is formed into a buried source/drain. The first dopant is formed into the pocket doping region at the edge of the channel region of the buried source/drain periphery as a result of thermal diffusion. Finally, a conductive gate is formed on the substrate.

In accordance with the present invention, a dopant of the pocket doping region is first implanted into the source/drain and the thermal diffusion method is employed to form the pocket doping region. The present method can effectively control the shape of the pocket doping region and avoid the irregular shape formed by tilt angle ion implantation. Moreover, the width of the pocket doping region can be effectively controlled. Thus, the effect of shortening of the channel region can be avoided so as to increase the breakdown voltage of the element.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
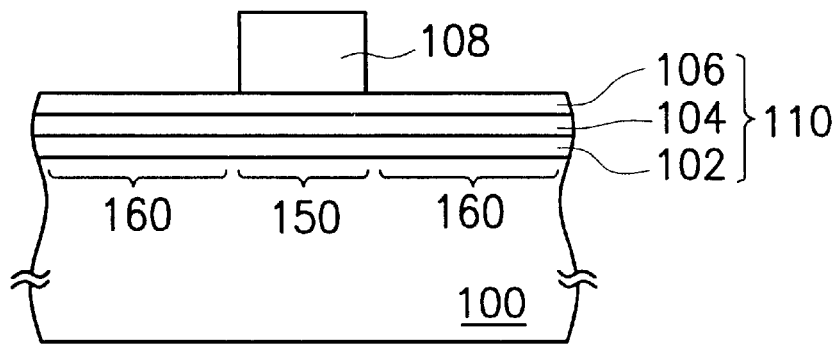
FIGS. 1 to 5 are schematic illustrations of a method of fabricating a silicon nitride read only memory of a preferred embodiment in accordance with the present invention.

The preferred embodiment of the present invention will be described with reference to the accompanying drawings. Like or corresponding members are designated by like reference characters or corresponding reference characters.

FIGS. 1 to 5 are schematic illustrations of a method of fabricating a silicon nitride read only memory of a preferred embodiment in accordance with the present invention. As shown in FIG. 1, an oxide layer 102, a nitride layer 104, a dielectric layer 106 are formed successively on a substrate 100. The oxide layer 102, the nitride layer 104 and the dielectric layer 106 are combined and are known as trapping layer 110. An example of oxide layer 102 is silicon oxide layer, an example of nitride layer 104 is silicon nitride layer, and an example of dielectric layer 106 is silicon oxide. The method of forming oxide layer 102 is, for example, thermal oxidation, and the method of forming nitride layer 104 is, for example chemical vapor phase deposition.

Next, a patterned photoresist layer 108 is formed on the substrate 100. The substrate 100 region of the lower section of the trapping layer 110 masked by the photoresist layer 108 is defined as channel region 150, and the partial substrate 100 region of the lower section of the trapping layer 110 unmasked by the photoresist layer 108 is defined as source/drain region 160, wherein the photoresist layer 108 includes one of the positive photoresist layer and negative photoresist layer.

Figure 2:
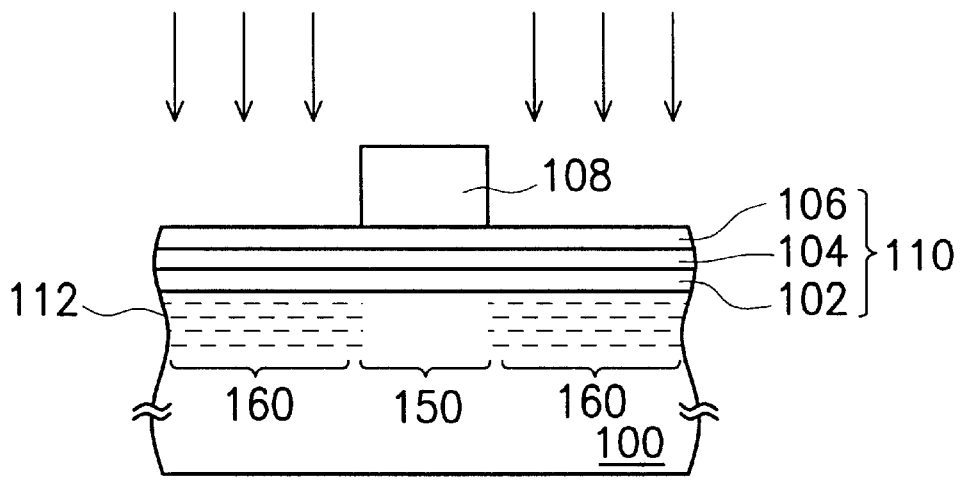

Next, as shown in FIG. 2, the photoresist layer 108 is used as a screen in a pocket ion implantation step. A first dopant 112 is implanted into the source/drain region 160 of the substrate 100, and an example of the first dopant 112 is P-type dopant, including Boron ions or $BF_2$ ions. If the implanted P-type dopant is Boron ions in the step of pocket ion implantation step, the dosage of implantation is about $5.0 \times 10^{12}/cm^2$ to $1.0 \times 10^{13}/cm^2$, and the energy of implantation is about 40 KeV to 60 KeV.

Figure 3:
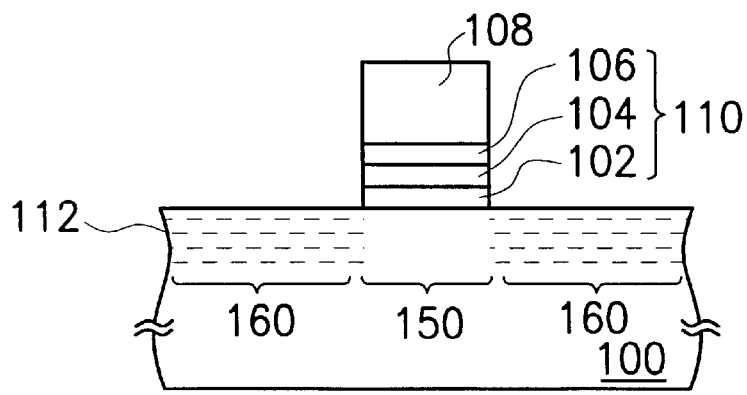

Next, as shown in FIG. 3, the photoresist layer 108 is employed as a screen to perform the etching step. Part of the trapping layer 110 is removed to expose the substrate 100 so as to pattern the trapping layer 110. The trapping layer 110 is partially removed by, for example, dry-etching.

Figure 4:
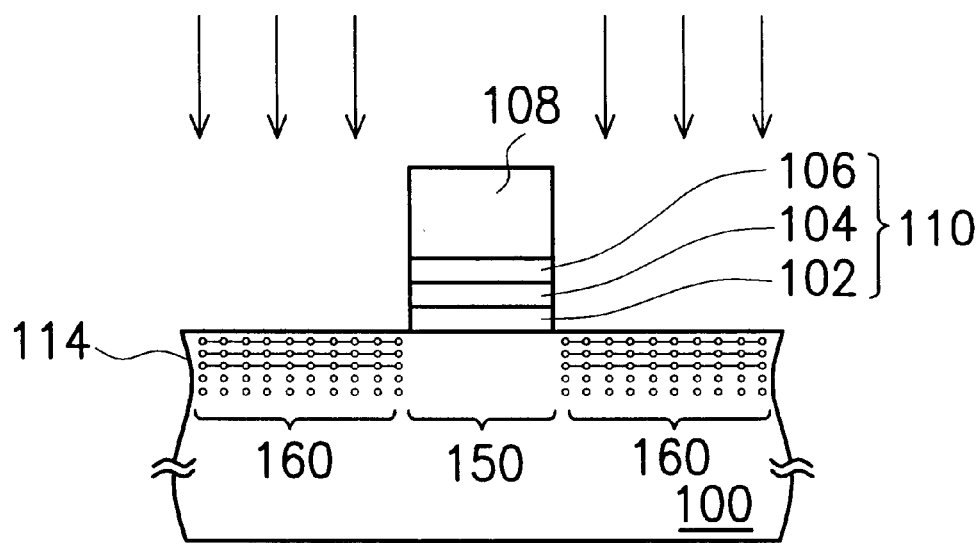

Next, as shown in FIG. 4, the photoresist layer 108 is used as a screen to perform the source/drain ion implantation step and a second dopant 114 is implanted into the source/drain region 160 of the substrate 100. An example of the second dopant 114 is an N-type dopant, and the N-type dopant is either Arsenic ions or phosphorus ions. If the N-type dopant is implanted at the step of source/drain ion implantation, the dose thereof is, for example, about $2.0 \times 10^{15}/cm^2$ to $4.0 \times 10^{15}/cm^2$, and the dosage energy of implantation is, for example, about 40 KeV to 60 KeV.

Figure 5:
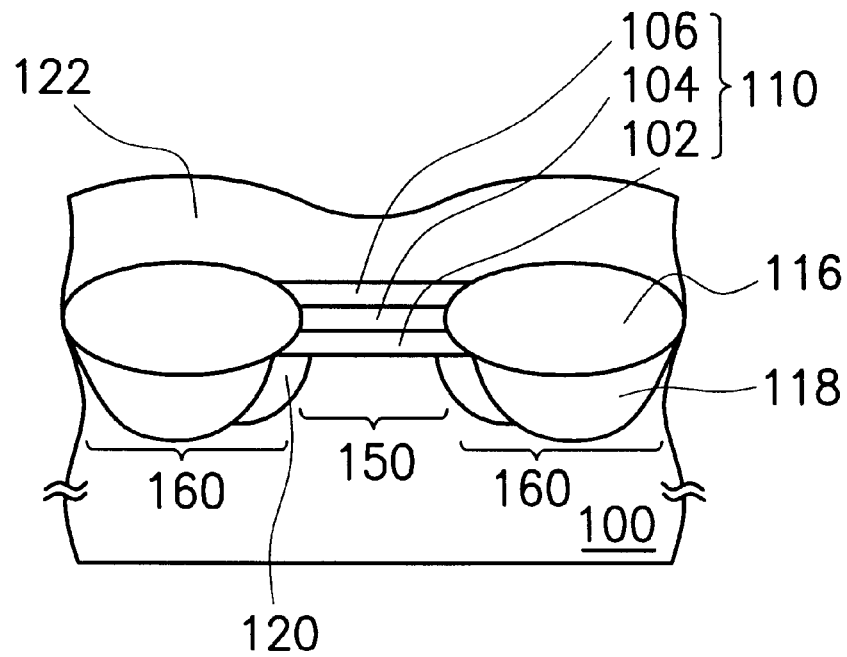

Next, as shown in FIG. 5, the photoresist layer 108 is removed to expose the trapping layer 110 and the method of removal of the photoresist layer 108 is, for example, wet stripping or dry stripping.

Next, the trapping layer 110 is employed as a screen while performing the thermal step so as to cause the surface of the substrate 100 of the source/drain region to form into a buried source/drain oxide layer 1 16.

At the same time, the second dopant 114 forms a buried source/drain 118 at the lower section of the buried source/drain oxide layer 116 via thermal diffusion.

Due to thermal diffusion, the first dopant forms a pocket doping region 120 at the edge of the channel region 150 of the buried source/drain 118 periphery. The thermal process is implemented at a temperature ranging from about 750° C. to 900° C., for example.

The mass of the first dopant 112 is smaller than that of the second dopant 114, therefore, the diffusion rate of the first dopant 112 is larger than that of the second dopant 114. As a result, in the process of thermal diffusion, the first dopant diffuses from the first dopant doping region 112 to the channel of the substrate 100 below the trapping layer 110 to form a pocket doping region at the edge of the channel region 150 of the buried source/drain 118 periphery.

Next, a conductive layer is formed on the substrate 100 and by the application of a photolithography etch method, the conductive layer is patterned to form a conductive gate 122.

Figure 6:
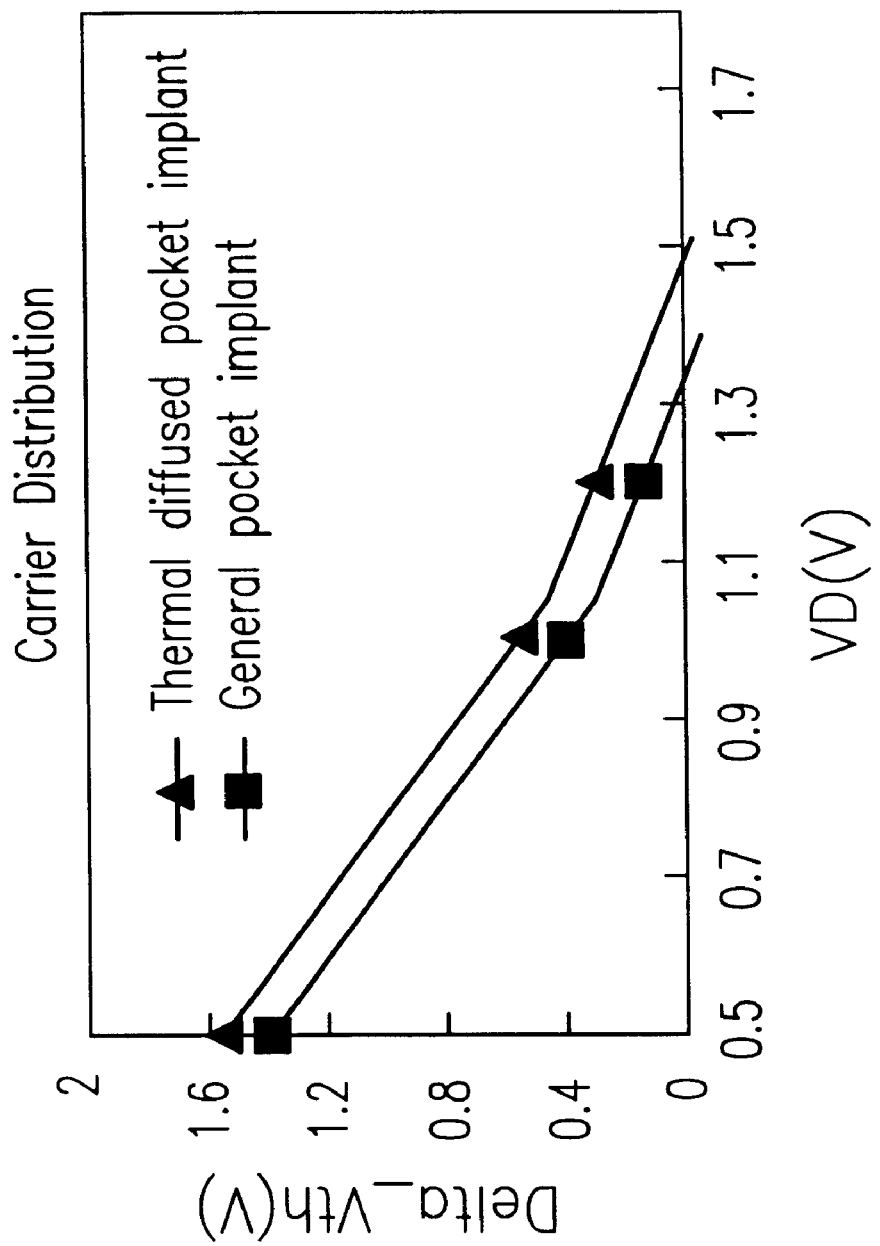
FIG. 6 is a graph showing the relationship of drain voltage and threshold voltage of silicon nitride read only memory of the preferred embodiment in accordance with the present invention.

Next, referring to FIG. 6, there is shown a comparison of a pocket doping region formed by thermal diffusion method of the present invention and that formed by the tilt angle ion implantation method. In view of experimental data, the threshold voltage of the pocket doping region, under similar drain voltage and with the carrier being implanted into the trapping layer, is smaller than that of the conventional pocket doping region. This is because the size and the configuration of the pocket doping region can be effectively controlled to maintain a specific channel length. As a result, the reverse short channel effect will not occur and the threshold voltage is rather stable.

The present invention employs thermal diffusion method to form a pocket doping region, and therefore, the shape of the pocket doping region can be effectively controlled. As a result, the irregular shape caused by the tilt angle ion implantation can be avoided. Due to the fact that the width of the pocket doing region is effectively controlled, the channel region shortening effect is avoided and the breakdown voltage of the element is increased.

While the invention has been described with respect to preferred embodiments, it will be clear to those skilled in the art that modifications and improvements may be made to the invention without departing from the spirit and scope of the invention. Therefore, the invention is not to be limited by the specific illustrative embodiment, but only by the scope of the appended claims.

What is claimed is:

1. A method of fabricating a silicon nitride read only memory (NROM), comprising:

providing a substrate forming a trapping layer on the substrate, wherein the trapping layer is formed of an oxide layer, a nitride layer on the oxide layer and a dielectric layer on the nitride layer;

forming a patterned photoresist layer on the substrate, wherein the substrate region at a lower portion of the trapping layer masked by the photoresist is defined as a channel, and a substrate region at the lower portion of the trapping layer not covered by the photoresist is defined as a source/drain region;

performing a pocket ion implantation step while using the photoresist layer as a mask and implanting a first dopant into the source/drain region of the substrate;

removing a part of the trapping layer while using the first dopant as a mask to pattern the trapping layer;

performing a source/drain ion implantation step while using the photoresist layer as a mask and implanting a second dopant into the source/drain region of the substrate;

removing the photoresist layer, and performing a thermal process using the trapping layer as a mask, wherein a surface of the substrate of the source/drain region forms a buried source/drain oxide layer while the second dopant in the buried source/drain oxide layer simultaneously forms a buried source/drain as a result of thermal diffusion, and the first dopant at an edge of the channel region located at a periphery of the source/drain source forms a pocket doped region; and forming a conductive gate on the substrate.

2. The method of claim 1, wherein the first dopant is P-type and the second dopant is N-type.

3. The method of claim 2, wherein the first dopant includes boron ions.

4. The method of claim 2, wherein when the first dopant of the pocket ion implantation is Boron ions, a dosage thereof is about $5.0 \times 10^{12}/cm^2 - 1.0 \times 10^{13}/cm^2$.

5. The method of claim 4, wherein an energy of the pocket ion implantation is about 40 KeV to 60 KeV.

6. The method of claim 2, wherein the second dopant is arsenic ions or phosphorus ions.

7. The method of claim 2, wherein when the second dopant of the source/drain ion implantation is arsenic ions, a dosage thereof is about $2.0 \times 10^{15}/cm^2$ to $4.0 \times 10^{15}/cm^2$.

8. The method of claim 7, wherein an energy of the source/drain ion implantation is about 40 KeV to 60 KeV.

9. The method of claim 1, wherein the thermal process is carried out at a temperature ranging from about 750° C. to 900° C.

* * * * *